United States Patent [19]

Sotiriou

[11] 4,225,899
[45] Sep. 30, 1980

[54] GROUND DETECTING DEVICE

[76] Inventor: George Sotiriou, 212-11 47th Ave., Bayside, N.Y. 11361

[21] Appl. No.: 1,438

[22] Filed: Jan. 8, 1979

[51] Int. Cl.$^3$ .............................................. H02H 3/14
[52] U.S. Cl. .................................... 361/188; 361/42; 361/203; 361/212; 340/649; 340/652
[58] Field of Search ................. 361/188, 42, 204, 203, 361/212, 216, 217, 218, 219; 340/649, 652

[56] References Cited

U.S. PATENT DOCUMENTS

| 2,611,862 | 9/1952 | Riddle et al. | 340/649 X |
| 2,884,594 | 4/1959 | Ludvigsen | 361/188 X |
| 3,040,211 | 6/1962 | Caldwell | 340/649 X |
| 3,250,960 | 5/1966 | Walbridge | 361/188 |
| 4,110,807 | 8/1978 | Neuhouser | 340/652 X |

*Primary Examiner*—Harry E. Moose, Jr.
*Attorney, Agent, or Firm*—Daniel Jay Tick

[57] ABSTRACT

A ground detecting device for a vehicle, craft, or the like, having a storage tank mounted on the vehicle, or the like, equipment for selectively controlling the pumping of fluid into and out of the storage tank, comprises a transformer having first, second and third windings, the third winding being electrically connected to ground. A jack is electrically connected in shunt with the third winding. A prong is electrically connected to the vehicle, craft, or the like, and cooperates with the jack, when inserted therein, to short-circuit the third winding to ground. The short-circuit has a short-circuit impedance resulting in a voltage differential at the second winding. A comparator amplifier has a sensing input electrically connected to the second winding, a reference input, and an output. An astable multivibrator has an output electrically connected to the reference input of the comparator amplifier and to the first winding and supplies a reference input signal thereto. A relay has a relay energizing winding electrically connected to the output of the comparator amplifier and controls the equipment for selectively controlling the pumping of fluid into and out of the storage tank. When the vehicle, craft, or the like, is short-circuited, so that static electricity is dissipated from the vehicle, craft, or the like, the short-circuit is reflected at the primary winding of the transformer and produces a voltage drop between the reference input signal and the sensing input of the comparator amplifier. The voltage drop causes saturation of the amplifier resulting in energization of the relay energizing winding and operation of the equipment.

4 Claims, 2 Drawing Figures

GROUND DETECTING DEVICE

BACKGROUND OF THE INVENTION

The present invention relates to a ground detecting device. More particularly, the invention relates to a ground detecting device for a vehicle having a chassis, a storage tank mounted on the chassis and equipment for selectively controlling the pumping of fluid into and out of the storage tank.

In a vehicle such as, for example, a tank truck, storing flammable or volatile liquids or gases, there is a considerable hazard of an explosion triggered by static discharge from the vehicle. It is therefore of extreme importance to life and to prevent injury to people and damage to property, that static charges be safely dissipated to ground especially while the vehicle is loading or unloading volatile fluids.

The principal object of the invention is to provide a ground detecting device of simple structure for preventing the ignition of volatile fluids by static electricity during loading and unloading of a storage tank.

An object of the invention is to provide a ground detecting device of simple structure, which is inexpensive in manufacture, installed with facility and convenience of any type of vehicle, craft, or the like, and eliminates the possibility of explosion due to static electricity.

Another object of the invention is to provide a ground detecting device of simple structure, which is inexpensive in manufacture, and functions efficiently, effectively and reliably to sufficiently ground a vehicle, craft, or the like, loading or unloading volatile fluids, thereby eliminating the accumulation of static charges on the vehicle, craft, or the like.

Still another object of the invention is to provide a ground detecting device of simple structure, which is inexpensive in manufacture, installed with facility and convenience on any type of vehicle, craft, or the like, storing volatile fluids, and functions efficiently, effectively and reliably to permit loading and unloading of volatile fluids only when there is a direct grounding of the vehicle, craft, or the like, to eliminate all static charges accumulated on the vehicle, craft, or the like, and all charges which develop during loading and unloading.

Yet another object of the invention is to provide a ground detecting device for terminating the flow of a combustible or volatile fluid into or out of a storage tank upon the sensing of an inadequate electrical discharge circuit between the vehicle, craft, or the like, carrying such tank, and ground.

BRIEF SUMMARY OF THE INVENTION

In accordance with the invention, a ground detecting device for a vehicle, craft, or the like, having a storage tank mounted on the vehicle, or the like, and equipment for selectively controlling the pumping of fluid into and out of the storage tank, comprises a transformer having first, second and third windings, the third winding being electrically connected to ground. A jack is electrically connected in shunt with the third winding. A prong is electrically connected to the vehicle, craft, or the like, and cooperates with the jack, when inserted therein, to short-circuit the third winding to ground. The short-circuit has a short-circuit impedance resulting in a voltage differential at the second winding. A comparator amplifier has a sensing input electrically connected to the second winding and a reference input. The comparator amplifier has an output. An astable multivibrator has an output electrically connected to the reference input of the comparator amplifier and to the first winding and supplies a reference input signal thereto. A relay has a relay energizing winding electrically connected to the output of the comparator amplifier and controls the equipment for selectively controlling the pumping of fluid into and out of said storage tank whereby when the vehicle is short-circuited, so that static electricity is dissipated from the vehicle, the short-circuit is reflected at the primary winding of the transformer and produces a voltage drop between the reference input signal and the sensing input of the comparator amplifier, the voltage drop causing saturation of the amplifier resulting in energization of the relay energizing winding and operation of the equipment.

The transformer is a semi-toroidal transformer. The first and third windings have a turns ratio of 1:1 and the second winding has a turns ratio of 1:2 with respect to the first and third windings.

A casing protects its contents from explosion. The ground detecting device is housed in the casing.

The jack comprises a jack housing having spaced opposite first and second ends. The first end of the jack housing is open. Electrical conductors are electrically connected to the third winding and pass into the jack housing through the second end thereof. A block of electrically insulative material is provided in the jack housing. A pair of electrically conductive resilient jaws are mounted at one end thereof on the block and open at the second end of the jack housing for accommodating the prong in electrical contact. A pair of reinforcing leaf springs of electrically conductive material are mounted at one end thereof on the block and each abuts a corresponding one of the jaws and urges it toward the other. An electrically conductive contact leaf spring is mounted at one end thereof on the block, electrically connected at the one end to one of the electrical conductors, and extends in operative proximity with one of the reinforcing leaf springs in a manner whereby when the prong is inserted in the jack the jaws and the reinforcing leaf springs are spaced farther apart so that one of the reinforcing leaf springs makes electrical contact with the contact leaf spring.

BRIEF DESCRIPTION OF THE DRAWINGS

In order that the invention may be readily carried into effect, it will now be described with reference to the accompanying drawings, wherein.

DETAILED DESCRIPTION OF THE INVENTION

The ground detecting device of the invention is for a vehicle, craft, or the like, 1, having a storage tank 2 mounted on said vehicle, craft, or the like, and equipment 3 (FIG. 1) for selectively controlling the pumping of fluid into and out of said storage tank. The vehicle, craft, or the like, 1, may comprise a gasoline or other liquid chemical tank truck, a gas tank truck, a fuel barge, a gas container seagoing vessel, a tanker aircraft, or the like.

Figure 1:
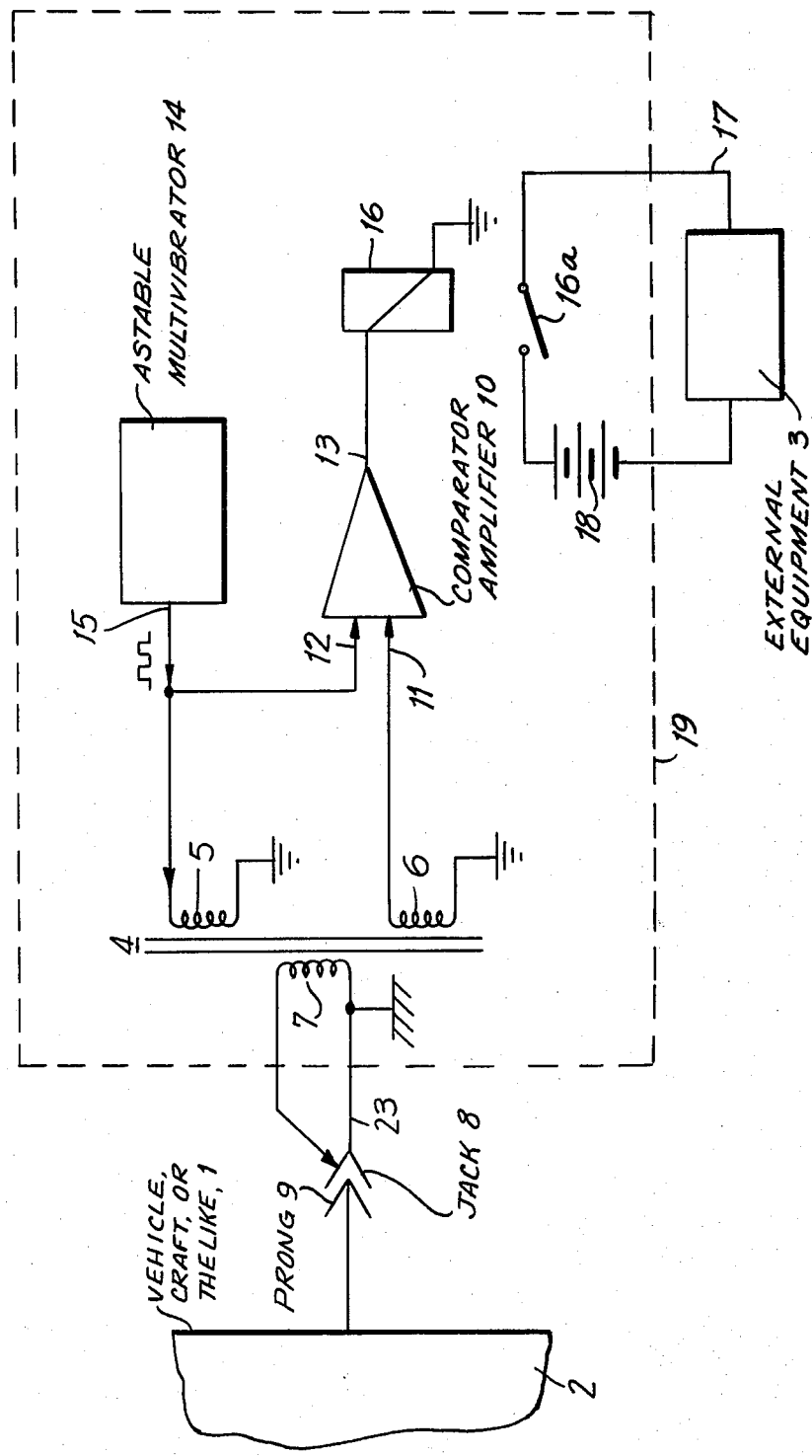
FIG. 1 is a circuit diagram of the ground detecting device of the invention.

The ground detecting device of the invention comprises a transformer 4 having first, second and third windings 5, 6 and 7, respectively (FIG. 1). The transformer 4 is preferably a semitoroidal transformer of which the first and third windings 5 and 7 have a turns ratio of 1:1 and the second winding 6 has a turns ratio of 1:2 with respect to the first and third windings. The third winding 7 is selectively connected to ground, as shown in FIG. 1. The semi-toroidal transformer 4 isolates the supply voltage from the vehicular or craft conductor.

A jack 8 (FIGS. 1 and 2) is selectively connected in shunt with the third winding 7, as shown in FIG. 1. A prong 9 (FIGS. 1 and 2) is electrically connected to the vehicle, craft, or the like, 1, and preferably to the storage tank 2 thereof. The prong 9 cooperates with the jack 8, when inserted therein, to short-circuit the third winding 7 to ground, as shown in FIG. 1. The short-circuit impedance results in a voltage differential at the second winding 6 of the transformer 4.

A comparator amplifier 10 of any suitable known type has a sensing input 11 electrically connected to the second winding 6 of the transformer 4 and a reference input 12, as shown in FIG. 1. The comparator amplifier 10 also has an output 13 (FIG. 1).

An astable multivibrator 14 of any suitable known type has an output 15 electrically connected to the reference input 12 of the comparator amplifier 10 and to the first winding 5 of the transformer 4, and supplies a reference input signal consisting of a pulse train having a frequency of 120 Hertz, a pulse amplitude of 12.0 volts and a duty cycle of 50% to said amplifier and winding.

A relay has a relay energizing winding 16 connected to the output 13 of the comparator amplifier 10 and controlling the equipment 3 for selectively controlling the pumping of fluid into and out of the storage tank 2. This is accomplished by a relay contact switch 16a controlled in operation by the relay energizing winding 16 and connected in an energizing circuit 17 of the external equipment 3. Thus, when the relay energizing winding 16 is energized, it closes the relay contact switch 16a thereby closing the equipment energizing circuit 17 to operate the equipment 3 to pump fluid into or out of the storage tank 2.

When the vehicle, craft, or the like, 1, is short-circuited, so that static electricity is dissipated from said vehicle, craft, or the like, to ground, the short-circuit is reflected at the first winding 5 of the transformer 4 and produces a voltage drop between the reference input signal and the sensing input of the comparator amplifier 10. The voltage drop causes saturation of the amplifier 10, which results in energization of the relay energizing winding 16. The energization of the relay energizing winding 16 results in the closing of the equipment energizing circuit 17 to energize the equipment 3 to pump fluid.

The equipment energizing circuit 17 includes a source of electrical energy 18 which may comprise, for example, a storage battery, or any suitable source of electrical energy.

A casing 19, indicated by broken lines in FIG. 1, protects anything within said casing from explosion. The ground detecting device of the invention is housed in the casing 19 thereby protecting it from explosion.

Figure 2:
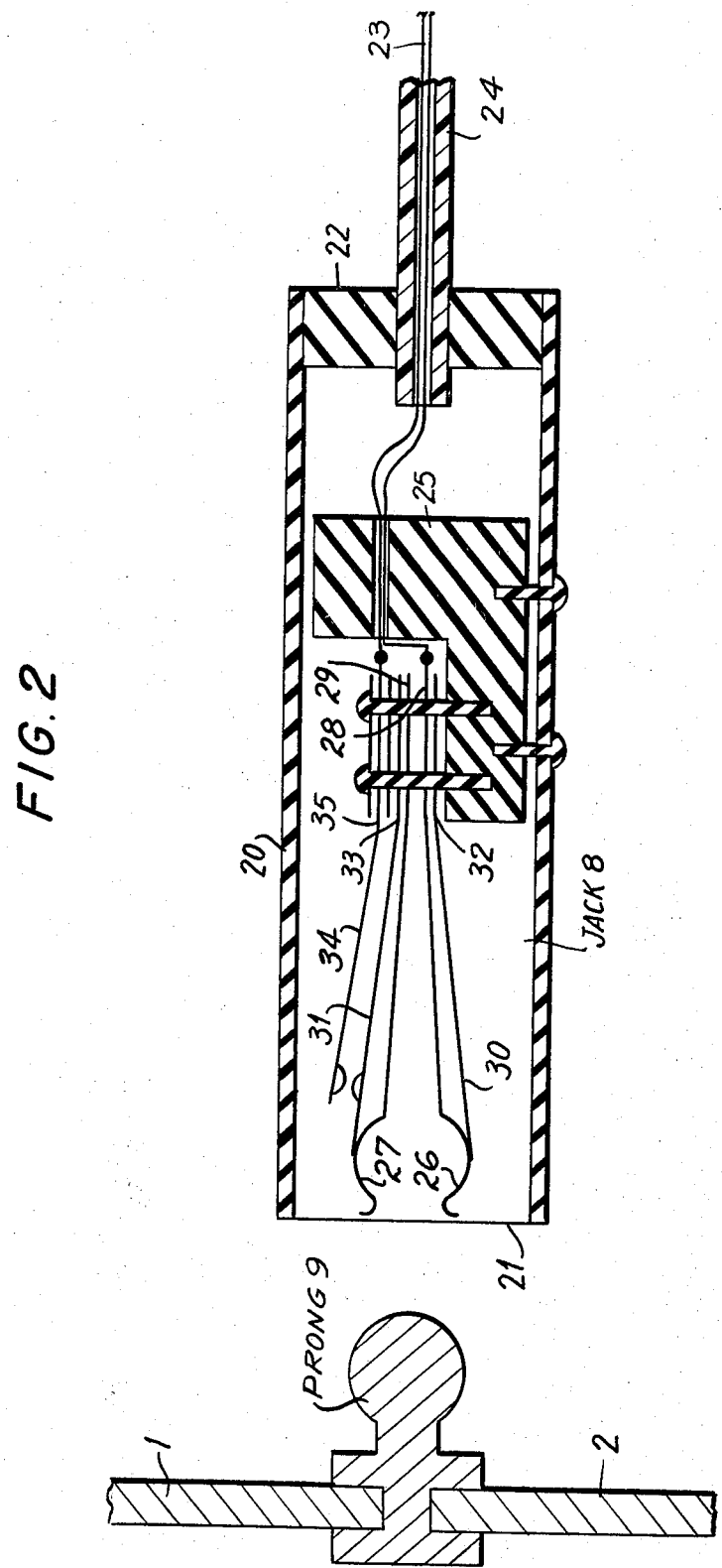
FIG. 2 is a sectional view, of an embodiment of a jack and prong coupling of the ground detecting device of the invention.

As shown in FIG. 2, the jack 8 comprises a jack housing 20 of electrically insulative material of any suitable type such as, for example, rubber. The jack housing 20 has spaced opposite first and second ends 21 and 22, respectively. The first end 21 of the jack housing 20 is open. Electrical conductors 23 are electrically connected to the third winding 7 of the transformer 4, as shown in FIG. 1, and pass into the jack housing 20 through the second end 22 thereof, as shown in FIG. 2. The electrical conductors 23 are suitably insulated by electrically insulative material 24.

A block 25 of electrically insulative material of any suitable type such as, for example, plastic or Bakelite, is mounted in the jack housing 20, as shown in FIG. 2. A pair of electrically conductive resilient jaws 26 and 27 are mounted at one end 28 and 29, respectively, thereof on the block 25 in the jack housing 20 and open at the first end of said jack housing. The jaws 26 and 27 comprise any suitable electrically conductive resilient material such as, for example, copper, and accommodate the prong 9 in electrical contact. A pair of reinforcing leaf springs 30 and 31 of electrically conductive material of any suitable type are mounted at one end 32 and 33, respectively, thereof on the block 25 in the housing 20. The reinforcing leaf springs 30 and 31 may comprise any suitable electrically conductive springlike material such as, for example, copper. The reinforcing leaf springs 30 and 31 abut the jaws 26 and 27, respectively, as shown in FIG. 2, and urge said jaws toward each other.

An electrically conductive contact leaf spring 34 is mounted at one end 35 thereof on the block 25 (FIG. 2). The contact leaf spring may comprise any suitable electrically conductive spring-like material such as, for example, copper, and is electrically connected at its one end 35 to one of the electrical conductors 23, as shown in FIG. 2. The contact leaf spring 34 extends in operative proximity with the reinforcing leaf spring 31 in a manner whereby when the prong 9 is inserted in the jack 8, and more particularly, between the jaws 26 and 27, said jaws and the reinforcing leaf springs 30 and 31 are spaced farther apart, so that the reinforcing leaf spring 31 moves into electrical contact with the contact leaf spring 34, thereby closing a circuit from the vehicle, craft, or the like, to ground.

The reference input signal is preferably a square wave, as shown in FIG. 1.

The input impedance of the comparator amplifier 10 is preferably $10^{12}$ ohms and the comparator amplifier preferably has a response time of 200 nanoseconds.

The electrically conductive jaws, reinforcing leaf springs and contact leaf spring 26, 27, 30, 31 and 34, respectively, of the jack 8 are mounted via electrically insulative Teflon washers and grommets.

The ground detecting device of the invention is able to sense a terminal resistance of 1.0 ohm or less and has a terminal voltage at a 1.0 ohm load of 10 millivolts or 0.01 volt with a 10 milliamp or 0.01 amp loop current. This provides a power rating of 100 microwatts. The unit operates at 115 volts AC at 50 to 60 Hertz and at a temperature of −40° to 185° F.

While the invention has been described by means of a specific example and in a specific embodiment, I do not wish to be limited thereto, for obvious modifications will occur to those skilled in the art without departing from the spirit and scope of the invention.

I claim:

1. A ground detecting device for a vehicle, craft, or the like, having a storage tank mounted on the vehicle, or the like, and equipment for selectively controlling the pumping of fluid into and out of the storage tank, said ground detecting device comprising a transformer having first, second and third windings, said third winding being electrically connected to ground;

a jack electrically connected in shunt with said third winding;

a prong electrically connected to the vehicle, craft, or the like, and cooperating with said jack, when inserted therein, to short-circuit said third winding to ground, said short-circuit having a short-circuit impedance resulting in a voltage differential at said second winding;

a comparator amplifier having a sensing input electrically connected to said second winding and a reference input, said comparator amplifier having an output;

an astable multivibrator having an output electrically connected to the reference input of said comparator amplifier and to said first winding and supplying a reference input signal thereto; said a relay having a relay energizing winding electrically connected to the output of said comparator amplifier and controlling the equipment for selectively controlling the pumping of fluid into and out of said storage tank whereby when said vehicle, craft, or the like, is short-circuited, so that static electricity is dissipated from said vehicle, craft, or the like, to ground, the short-circuit is reflected at the first winding of the transformer and produces a voltage drop between the reference input signal and the sensing input of said comparator amplifier, said voltage drop causing saturation of said amplifier resulting in energization of the relay energizing winding and operation of said equipment.

2. A ground detecting device as claimed in claim 1, wherein said transformer is a semi-toroidal transformer, said first and third windings have a turns ratio of 1:1 and said second winding has a turns ratio of 1:2 with respect to the first and third windings.

3. A ground detecting device as claimed in claim 1, further comprising a casing for protecting its contents from explosion, said ground detecting device being housed in said casing.

4. A ground detecting device as claimed in claim 1, wherein said jack comprises a jack housing having spaced opposite first and second ends, the first end of said jack housing begin open, electrical conductors electrically connected to said third winding and passing into said jack housing through the second end thereof, a block of electrically insulative material in said jack housing, a pair of electrically conductive resilient jaws mounted at one end thereof on the block and opening at said first end of said jack housing for accommodating said prong in electrical contact, a pair of reinforcing leaf springs of electrically conductive material mounted at one end thereof on the block and each abutting a corresponding one of said jaws and urging it toward the other, and an electrically conductive contact leaf spring mounted at one end thereof on the block, electrically connected at said one end to one of the electrical conductors, and extending in operative proximity with one of said reinforcing leaf springs in a manner whereby when said prong is inserted in said jack, said jaws and said reinforcing leaf springs are spaced farther apart, so that said one of said reinforcing leaf springs moves into electrical contact with said contact leaf spring.

* * * * *